United States Patent
Lippincott (12)

(10) Patent No.: US 6,366,516 B1
(45) Date of Patent: Apr. 2, 2002

(54) MEMORY SUBSYSTEM EMPLOYING POOL OF REFRESH CANDIDATES

(75) Inventor: Louis A. Lippincott, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/753,005

(22) Filed: Dec. 29, 2000

(51) Int. Cl.[7] .................................................. G11C 7/00
(52) U.S. Cl. .................................. 365/222; 365/189.07
(58) Field of Search ............................ 365/222, 189.07

(56) References Cited

U.S. PATENT DOCUMENTS

| | | | |
|---|---|---|---|
| 4,982,369 A | * 1/1991 | Tatematsu | 365/222 |
| 5,768,193 A | * 6/1998 | Lee et al. | 365/185.25 |
| 5,774,404 A | 6/1998 | Satoshi | |
| 5,796,992 A | 8/1998 | Reif et al. | |
| 5,822,265 A | 10/1998 | Zdenek | |
| 5,822,266 A | 10/1998 | Kikinis | |
| 5,907,857 A | 5/1999 | Biswas | |
| 5,956,281 A | * 9/1999 | Nakai et al. | 365/222 |
| 5,999,474 A | 12/1999 | Leung et al. | |
| 6,118,719 A | 9/2000 | Dell et al. | |

* cited by examiner

Primary Examiner—Son T. Dinh
(74) Attorney, Agent, or Firm—Blakely, Sokoloff, Taylor & Zafman LLP

(57) ABSTRACT

A memory subsystem that includes a dynamic random-access memory (DRAM) having cells organized as an array of rows and columns, the cells being individually accessed by specifying a row address and a column address. An additional cell that stores a charge level is associated with each row of the DRAM. The charge level is characteristic of the charge level of the associated DRAM row, and is refreshed by a secondary or primary refresh cycle to the associated DRAM row. A threshold detector outputs a refresh signal when the charge of the additional cell drops below a predetermined threshold. Circuitry responsive to the refresh signal collects the row address of the additional cell and sends it to logic that generates a primary refresh cycle to the associated row address of the DRAM.

21 Claims, 4 Drawing Sheets

MEMORY SUBSYSTEM EMPLOYING POOL OF REFRESH CANDIDATES

FIELD OF THE INVENTION

The present invention relates generally to the field of semiconductor memories; more particularly, to dynamic random-access memories (DRAMS) and memory architectures that provide for DRAM refresh operations.

BACKGROUND OF THE INVENTION

Advances in central processor unit (CPU) performance and chipset density have outpaced improvements in memory bandwidth performance. One reason for this anomaly lies in the physical device characteristics and requirements of the components that make up the computer's memory subsystem.

In a standard computer system, the main or system memory is typically implemented with DRAM devices. In a DRAM, data is stored in a memory cell in the form of a capacitive charge that decays over time. To preserve the integrity of the data, periodic refreshing of the cell must occur in order to restore the charge level to its original, full capacity. In a typical refresh operation, which usually is performed every few milliseconds, the data is read and then rewritten back into the memory. In many cases, explicit refresh cycles occur to specified memory address at the direction of the subsystem memory controller. Reading or writing data to an addressed location in memory is another way that memory cells can be refreshed. (In the context of this specification, an explicit refresh cycle is called a primary refresh cycle. Refreshes that result from a read or write operation to a memory location are referred to as secondary refreshes.)

The problem, of course, is that normal memory activity (i.e., read and write accesses) cannot occur during the time that refresh operations are taking place. Refresh cycles therefore—while necessary for dynamic RAM subsystem operation—consume otherwise useful memory bandwidth.

In current dynamic RAM subsystems, a single timer, or a small set of timers controls primary refresh operations. The timer is set to an appropriate interval so as to insure that a refresh operation occurs before a known time it takes a DRAM cell to become completely discharged. When the timer expires, a primary refresh cycle is posted for execution. Generally, a sequential timer or counter is used to generate the address for the primary refresh cycle. The primary refresh cycle, with its address, is sent on to logic that either executes the cycle or posts it for later execution. An example of this latter approach is found in U.S. Pat. No. 5,907,857, which teaches refreshing dynamic memory in a burst that shifts memory refresh activity into periods of time in which the memory bus is relatively idle.

Various approaches have been developed to avoid the degradation of performance caused by imposing fixed interval refresh cycles on a DRAM. By way of example, U.S. Pat. No. 5,822,265 teaches a DRAM controller that performs a background refresh during times when the memory request input of the DRAM is idle after a measured time interval substantially less than the maximum refresh interval. U.S. Pat. No. 5,828,382 describes a method of interleaving refresh cycles to improve DRAM speed by reducing the time needed for a precharge sequence during a refresh cycle. The method involves grouping two or more consecutive refresh cycles, thereby effectively reducing precharge time per refresh operation.

Another improvement in the field is taught in U.S. Pat. No. 5,774,404, which discloses a DRAM having a refresh function that adjusts the refresh period according to the temperature-dependent data hold time of memory cells to reduce standby current.

Despite past efforts to overcome the memory bandwidth problem, computer systems utilizing DRAMs still suffer from a refresh overhead that can be as high as 15%. Consequently, there is an unfulfilled need for a new approach to improve memory subsystem performance.

BRIEF DESCRIPTION OF THE DRAWINGS

The present invention will be understood more fully from the detailed description which follows and from the accompanying drawings, which however, should not be taken to limit the invention to the specific embodiments shown, but are for explanation and understanding only.

DETAILED DESCRIPTION

The present invention is a method and apparatus that improves the utilization of the memory subsystem of a computer. In the following description, numerous details are set forth, such as specific circuit configurations, circuit configurations, device types, etc., in order to provide a thorough understanding of the invention. It will be clear, however, to one skilled in the art, that these specific details may not be needed to practice the present invention.

In a typical computer system, main memory is organized into an array of dynamic RAM memory cells that can be individually accessed by row and column addresses. Refreshes to DRAM can occur with either explicit refresh cycles (i.e., primary refreshes) or with reads and writes (i.e., secondary refreshes) to the same addresses. An important characteristic of a DRAM memory array is that when a row address is accessed or refreshed, all of the memory cells contained in that row have their stored charges restored to their original, full charge levels. The present invention it takes advantage of this characteristic by eliminating many primary refresh cycles, and only performing primary refresh cycles to only those rows in the memory that actually require to be refreshed.

Figure 1:
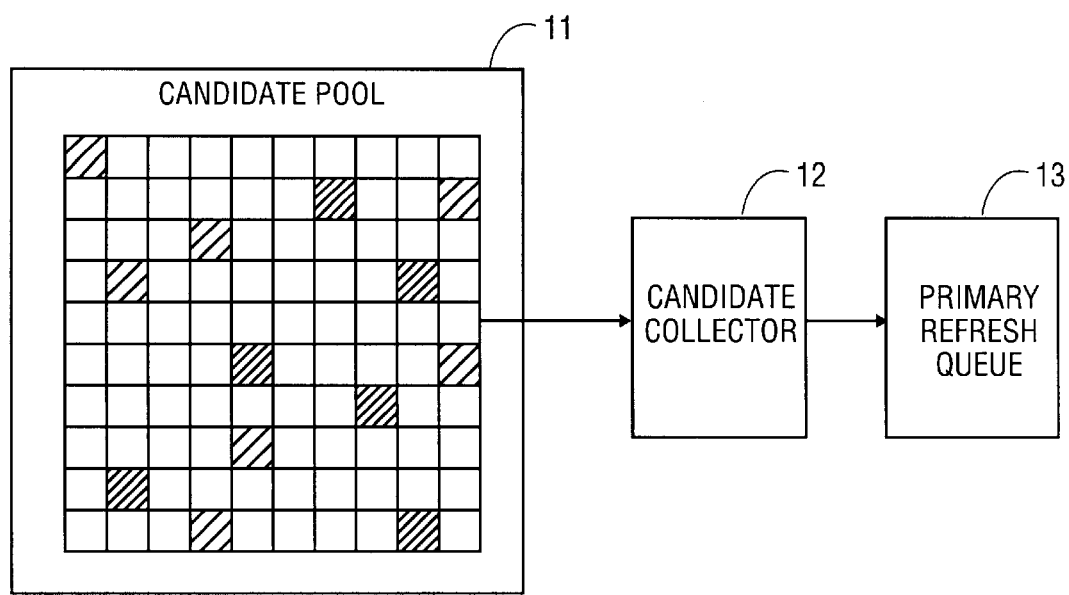
FIG. 1 is a conceptual diagram a system for generating and maintaining a pool of refresh candidates in accordance with the present invention.

FIG. 1 is an example that illustrates the basic architecture of the memory subsystem of the present invention. In the system of FIG. 1, device 11 uses DRAM to store data. For instance, DRAM device 11 may comprise a graphics frame buffer for storing an image to be displayed on a screen device. The various locations in a memory represent possible candidates for refresh cycles. That is, candidate collector 12 monitors DRAM device 11 to detect when the charge level of any storage location in the memory decays below a predetermined threshold level. In the example of FIG. 1, the critically decayed memory locations are illustrated by the dark shaded squares within the candidate pool. The critical locations must be refreshed soon, or data will be lost. Locations exhibiting some loss of charge—but not so much as to exceed the predetermined threshold—are shown as gray or lightly shaded squares. These locations have not been refreshed lately, but have yet to reach the critical level. White squares represent locations that have just been refreshed.

Once candidate collector 12 has determined which row address has crossed the predetermined threshold level, it sends these row addresses to the primary refresh queue 13. Primary refresh queue is a register stack structure that holds the collected row addresses candidates for refresh until they are sent to logic that handles the actual refresh cycle. This logic typically resides in the RAM controller of the memory subsystem.

A key concept of the present invention is that primary refresh cycles are only performed to those locations that actually need to be refreshed. No primary refreshes are performed to locations that are read (or written) during the normal activity of the DRAM. In the example of FIG. 1, where device 11 is a graphics frame buffer, primary refresh cycles are largely unnecessary since the information in the DRAM is constantly being restored (secondary refreshes) through read cycles used to display the stored image. The present invention takes advantage of this operational characteristic by scheduling for primary refresh only those memory location candidates that have actually suffered a loss of charge that exceeds a predetermined level. Thus, the memory subsystem of the present invention optimizes memory bandwidth performance by taking advantage of normally occurring read and write cycles that perform a secondary refresh function.

Practitioners familiar in the memory arts will appreciate that the present invention is generic to any memory subsystem that relies upon dynamic memory devices. In other words, the present invention is equally applicable to computer systems utilizing external RAM, CPUs having internal RAM structures, main memory, graphics systems, video processing devices, etc.

By way of illustration, in the case where the dynamic memory comprises an external RAM device, the invention shown in FIG. 1 may be implemented using an array of timers or counters for primary refresh cycles. A single timer would be associated with a single row of DRAM. Each timer would be set according to the known characteristic refresh time of the corresponding row within the dynamic RAM. The interval for each row is counted remotely by each timer, and the timer is reset every time a read, write or primary refresh is performed to the associated row address.

Continuing with the example of FIG. 1, the addresses for the primary refresh cycles are generated my candidate collector 12. However, is important to note that because the row timer is reset every time a read or write (i.e., a secondary refresh cycle) occurs, candidate collector 12 only collects those candidates in need of the primary refresh cycle. Candidate collector 12 may perform this function periodically by searching the candidate pool and then scheduling the primary refresh cycle addresses by placing them into the primary refresh queue 13. After the primary refresh cycle addresses are placed into the primary refresh queue 13, they are removed (by resetting their timers) from the candidate pool.

It should be understood that if there are secondary refresh cycles at addresses corresponding to the gray shaded squares in FIG. 1, they will be reset to white. If no secondary refresh cycles take place at an address for an extended period of time, the address location will eventually turned black (critical). The main idea of the present invention being that primary refresh cycles are executed only when needed, thereby saving memory bandwidth for normal memory read and write operations, the normal occurrence of which obviates the need for primary refresh cycles.

The primary refresh cycle timers may be implemented using ordinary logic devices. For example, the timers may comprise a single bit storage device, several bit counters, or standard analog circuits having known decay times. The primary refresh cycle timers may also be implemented in a static RAM (SRAM) array, with the bits are read out, aged, and then written back into the SRAM. Since the granularity of the timer affects the algorithm for collecting and scheduling refreshes, the implementation choice for the timer function may be dependent on the particular memory system application.

Also, it may be desirable to divide the candidate pool into smaller segments and skew the collection of the critical primary refresh cycle timers. This technique would insure that not all of the critical primary refresh cycle timers become critical at the same time.

Figure 2:
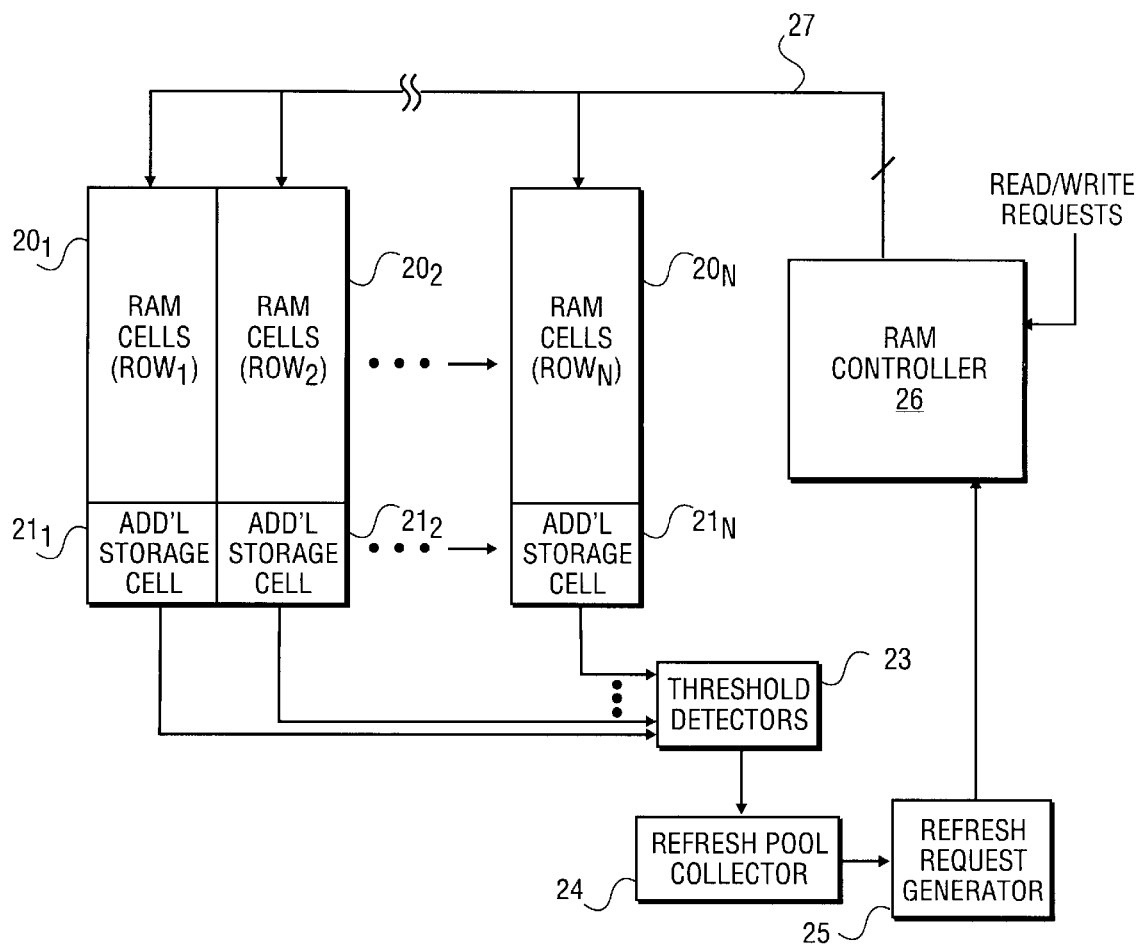
FIG. 2 is a circuit block diagram of a memory subsystem in accordance with one embodiment of the present invention.

FIG. 2 is a circuit diagram of another embodiment of the present invention comprising a DRAM in which the memory cells are arranged in rows 20. The example of FIG. 2 is generic since it shows N rows of cells, where N is an integer that is typically a power of 2 (e.g., 256, 512, 1024, etc.). Instead of adding a timer to each row of memory cells, the internal structure that the RAM is modified to include one additional storage cell 21. Additional storage cell 21 is not part of the memory array; rather, its purpose is to monitor the capacitive charge level of the memory cells within that row. In all other respects, however, cell 21 is fabricated identical to every other RAM cell in the associated row 20.

Figure 3:
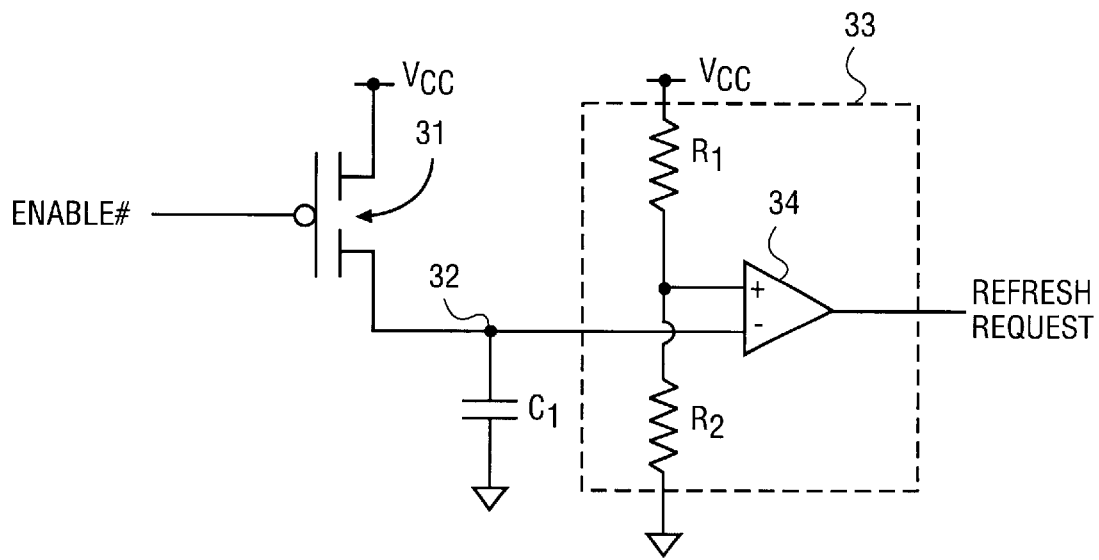
FIG. 3 is a detailed schematic diagram of a timer/detector circuit utilized in one embodiment of the present invention.

With reference to FIG. 3, a charge switch 31 is connected to the additional storage cell 21 in each row 20. FIG. 2 shows charge switch 31 connected between positive supply potential $V_{cc}$ and node 32. Capacitor $C_1$ denotes the capacitive charge stored in additional cell 21 at node 32. Every time a read, write, or refresh is performed at a row address of the DRAM, the ENABLE# input of charge switch 31 is activated. Activating the ENABLE# input turns on switch 31 such that the charge of the additional storage cell 21, as well as all of the cells in associated row 20, is restored to its original, fully charged level.

Node 32 is also connected to one input of comparator 34. The other input of comparator 34 is set to a voltage determined by the resistor divider network comprising resistors $R_1$ and $R_2$, coupled in series between $V_{cc}$ and ground. Together, the resistor divider network and comparator 34 comprise threshold detector 33. The charge threshold level is simply set by the values of $R_1$ and $R_2$. Threshold detected 33 simply monitors the charge present on the storage cell. When the charge at node 32 drops below the predetermined threshold level, comparator 34 outputs a refresh request signal causing a primary refresh cycle request to be placed in the refresh pool.

Because the additional storage cells 21 are manufactured identical to the RAM cells in each row 20 of the array, their physical characteristics are the same. This means that when the charge level of the additional storage cell 21 has decayed below the threshold level, all of the cells in the associated row 20 need to be refreshed.

The individual threshold detector structures 33 associated with each of the rows of the DRAM are collected in block 23 of FIG. 2. Essentially, there is a separate threshold detector 33 for each row 20. Refresh pool collector 24 has the same function as described in conjunction with FIG. 1. That is, refresh pool collector 24 removes the refresh requests out of the pool of candidates and sends them to the refresh request generator 25. Refresh pool collector 24 determines the address of the row that needs refreshing, as detected by block 23, and forwards the corresponding row address to generator 25.

Refresh pool collector 24 may be implemented using a variety of well known structures. For example, a collector 24 may be implemented as a standard first-in-first-out (FIFO) stack register. In a more sophisticated implementation, refresh pool collector 24 may include logic that prioritizes the collected refresh requests. Such a priority-ordering scheme would assign a higher priority to requests exceeding a Critical charge decay level, and a lower priority to rows that have exceeded a Request charge decay level (above the Critical level). Critical level requests are delivered first, followed by any Request level requests. Distinguishing between a Request threshold level and a Critical threshold level may be accomplished using additional detector structures or additional ordinary logic. Priority row ordering would have the salutary benefit of insuring that no cells are ever completely discharged, as might occur without such a scheme in cases where the subsystem is backed up with numerous refresh cycles.

Refresh request generator 25 receives as an input the addresses of the rows 20 of the DRAM that need a refresh cycle. Basically, generator 25 comprises a FIFO structure that sends the refresh cycle requests to the RAM controller 26, which handles the actual refresh cycle. In the diagram of FIG. 2, read, write, and refresh requests are transmitted by RAM controller 26 to DRAM via lines 27. These three types of request transmissions are basically used to enable charge switch 31 in the circuit of FIG. 3.

Figure 4:
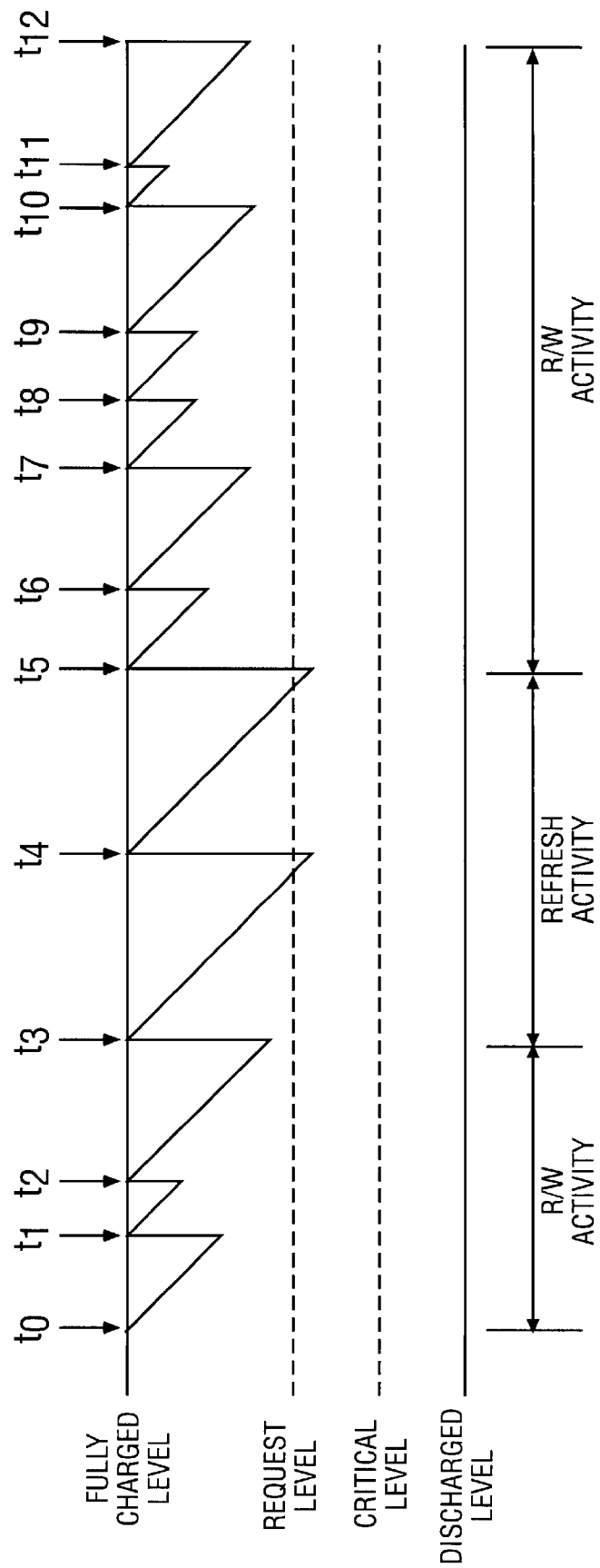
FIG. 4 is an example timing waveform diagram of memory subsystem operating in accordance with one embodiment of the present invention.

FIG. 4 is a timing waveform diagram illustrating the operation of one embodiment of the present invention. The "sawtooth" right triangles of the waveform represent the charge levels of various rows within the DRAM of the memory subsystem. As can be seen, charge levels decay over time (moving from left to right). The rate of charge loss of a particular row is denoted by the hypotenuse of a given triangle. For instance, the triangle shown between time $t_0$ and time $t_1$ illustrates the steady leakage of charge for a particular DRAM row. This row is recharged to the fully charged level at time $t_1$ as a result of a secondary refresh cycle, i.e., a read or write cycle. Note that the vertical side of each triangle denotes the refreshing of charge to the designated row. This charge restoration may result from a read, write or refresh cycle. The charge level of a particular row is restored to the Fully Charged Level at each of times $t_1$–$t_{12}$ shown in FIG. 4.

At times $t_1$, $t_2$, and $t_3$ the rows are refreshed as a result of normal read/write activity to the DRAM. This is evident in the diagram by the fact that the charge level in each of these three instances does not decay below the Request Level. According to this embodiment of the invention, when the charge level of an additional storage cell associated with a row drops below the Request Level threshold, refresh pool collector 24 collects the row address. The other words, the charge level of these rows are maintained by the normal occurrence of secondary refresh cycles. No primary refresh cycle need be issued for these rows during this time interval. The same is true with the time interval between the times $t_5$ and $t_{12}$ in FIG. 4. That is, rows of the RAM cells are refreshed in this time interval as a result of normal read/write activity.

The two triangles shown between times $t_3$ and $t_5$ represent rows that are refreshed through explicit refresh cycles. This is evident from the fact that the charge level of both of these rows decays past the Request Level threshold, which event may be detected by the threshold detector block 23. Note that if the charge level of these particular rows dropped below the Critical Level, they would receive priority status for refreshing, as described above.

Practitioners in the art will appreciate that the waveform diagram of FIG. 4 illustrates how the present invention achieves a substantial improvement in memory bandwidth performance over the prior art. During the entire time interval shown, only two primary refresh cycles needed to be performed. Again, this improvement in memory bandwidth performance is realized by taking advantage of normal read/write activity to the dynamic RAM in accordance with the present invention.

Figure 5:
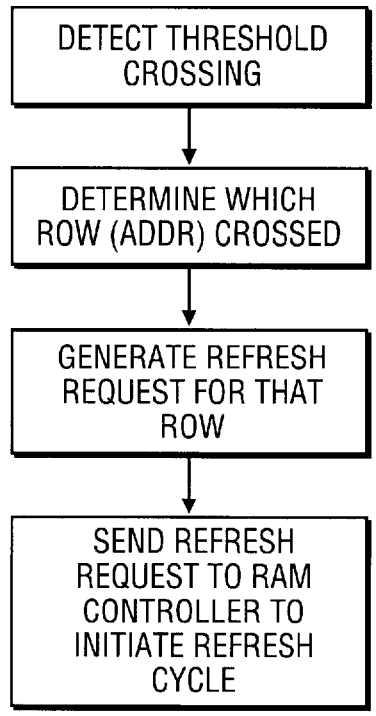
FIG. 5 is a flow diagram illustrating the basic method of the present invention.

The basic steps of the method described above are set forth in the flow chart diagram of FIG. 5. Given these basic steps, it should be appreciated that the present invention could be implemented in any one of a number of different ways. For example, in an alternative embodiment the pool collector and request generator functions could be merged into a single device implementation. In still other embodiments, a sophisticated controller device may incorporate the collection and request generation functions. Accordingly, the specification and drawings are to be regarded in an illustrative rather than a restrictive sense.

I claim:

1. A memory subsystem comprising:
   a dynamic random-access memory (DRAM) cells organized as an array of rows and columns, each row having a row address;
   an additional cell associated with each row of the DRAM, the additional cell storing a charge that is refreshed by a secondary or primary refresh cycle;
   a threshold detector to output a refresh signal when the charge of the additional cell drops below a predetermined threshold;
   circuitry to collect the row address of the row associated with the additional cell responsive to the refresh signal; and
   logic coupled to the circuitry to generate a primary refresh cycle to the row address of the DRAM.

2. The memory subsystem of claim 1 wherein the additional cell and the DRAM cells are fabricated on a single semiconductor substrate.

3. The memory subsystem of claim 2 wherein the additional cell is physically identical to the DRAM cells of the associated row.

4. The memory subsystem of claim 1 wherein the circuitry comprises a refresh pool collector coupled to the threshold detector.

5. The memory subsystem of claim 1 wherein the secondary refresh cycle comprises a read or write cycle.

6. The memory subsystem of claim 1 wherein the logic comprises a refresh request generator coupled to the refresh pool collector.

7. The memory subsystem of claim 6 wherein the logic further comprises a RAM controller coupled between the refresh request generator and the DRAM.

8. The memory subsystem of claim 1 wherein the threshold detector comprises a comparator having a first input coupled to the additional cell and a second input coupled to receive a threshold voltage.

9. The memory subsystem of claim 1 further comprising a charge switch that closes to refresh the charge of the additional cell in response to either the secondary or primary refresh cycles.

10. Apparatus for a system that includes a dynamic random-access memory (DRAM) having cells organized in rows, comprising:

a plurality of storage devices, each storage device being associated with a row of the DRAM and storing a temporal value characteristic of a capacitive charge of the row;

a detector to output a refresh signal when the temporal value of a storage device exceeds a threshold;

a collector circuit to collect a row address of the row in the DRAM associated with the storage device responsive to the refresh signal; and logic to generate a primary refresh cycle to the row address.

11. The apparatus of claim 10 wherein the storage devices each comprise a timer and the temporal value is a refresh interval.

12. The apparatus of claim 10 wherein the storage devices each comprise an additional bit cell having characteristics identical to the DRAM cells of the associated row.

13. The apparatus of claim 12 wherein the temporal value of each storage device is reset upon a read, write, or primary refresh cycle to the associated row of the DRAM.

14. The apparatus of claim 12 further comprising a charge switch coupled to the additional bit cell, the charge switch closing to reset the temporal value upon a read, write, or primary refresh cycle to the associated row of the DRAM.

15. The apparatus of claim 10 wherein the logic comprises a refresh request generator coupled to receive the row address from the collector circuit.

16. The apparatus of claim 15 wherein the logic further comprises a RAM controller coupled between the refresh request generator and the DRAM.

17. A method of operation for a memory subsystem, comprising:

outputting a refresh signal when a charge level of a storage cell decays below a predetermined threshold, the storage cell being appended to a row of DRAM cells;

determining the row address of the storage cell appended to a row of DRAM cells in response to the refresh signal; and generating a primary refresh request for the row of DRAM cells.

18. The method of claim 17 further comprising:

sending the primary refresh request to a RAM controller to initiate a primary refresh cycle to the row of DRAM cells, the primary refresh cycle restoring the charge level of the storage cell to a fully charged level.

19. The method of claim 17 further comprising:

restoring the charge level of the storage cell to a fully charged level in response to a read cycle before the charge level of the storage cell decays to the predetermined threshold.

20. The method of claim 17 further comprising:

restoring the charge level of the storage cell to a fully charged level in response to a write cycle before the charge level of the storage cell decays to the predetermined threshold.

21. The method of claim 17 wherein the storage cell and the DRAM cells are fabricated on a single semiconductor substrate.

* * * * *